United States Patent
Kojima et al.

(10) Patent No.: US 11,762,026 B2
(45) Date of Patent: Sep. 19, 2023

(54) BATTERY MONITORING APPARATUS (71) Applicant: DENSO CORPORATION, Kariya (JP)

(72) Inventors: Toshiki Kojima, Kariya (JP); Masakazu Kouda, Kariya (JP); Hayato Mizoguchi, Kariya (JP)

(73) Assignee: DENSO CORPORATION, Kariya (JP)

( * ) Notice: Subject to any disclaimer, the term of this patent is extended or adjusted under 35 U.S.C. 154(b) by 95 days.

(21) Appl. No.: 17/244,376

(22) Filed: Apr. 29, 2021

(65) Prior Publication Data

US 2021/0247455 A1    Aug. 12, 2021

Related U.S. Application Data

(63) Continuation of application No. PCT/JP2019/041938, filed on Oct. 25, 2019.

(30) Foreign Application Priority Data

Oct. 29, 2018    (JP) .................................. 2018-203298

(51) Int. Cl.
| | |
|---|---|
| *G01R 31/388* | (2019.01) |
| *G01R 31/364* | (2019.01) |
| *H01M 10/42* | (2006.01) |
| *H01M 10/48* | (2006.01) |

(52) U.S. Cl.
CPC ......... *G01R 31/388* (2019.01); *G01R 31/364* (2019.01); *H01M 10/425* (2013.01); *H01M 10/48* (2013.01); *H01M 10/482* (2013.01)

(58) Field of Classification Search
USPC .......................................... 324/426, 432–435
See application file for complete search history.

(56) References Cited

U.S. PATENT DOCUMENTS

| | | | |
|---|---|---|---|
| 9,269,991 B2 | 2/2016 | Takeshita | |
| 2015/0049930 A1 | 2/2015 | Brown | |
| 2020/0295413 A1* | 9/2020 | Yamazaki | G01R 31/382 |

FOREIGN PATENT DOCUMENTS

| | | |
|---|---|---|
| JP | 2015-516831 A | 6/2015 |
| JP | 6136820 B2 | 5/2017 |
| WO | 2014/184920 A1 | 11/2014 |

OTHER PUBLICATIONS

Dec. 17, 2019 International Search Report issued in International Patent Application No. PCT/JP2019/041938.

* cited by examiner

*Primary Examiner* — Vincent Q Nguyen
(74) *Attorney, Agent, or Firm* — Oliff PLC (57) ABSTRACT

A battery monitoring apparatus is used in a battery assembly equipped with a plurality of batteries connected in series with each other. A plurality of measuring lines are mounted on a given layer of a multi-layer substrate and work to measure electrical potentials developed at terminals of the batteries, respectively. The measuring lines are classified into measuring line groups in order of electrical potential from lowest to highest. A plurality of solid patterns are arranged on one of layers of the multi-layer substrate other than the given layer and provided one for each of the measuring line groups. The solid patterns overlap the measuring line groups in planar view in a stacking direction of the multi-layer substrate. The solid patterns are arranged away from each other. The higher electrical potentials of the measuring line groups are, the higher electrical potentials of the corresponding solid patterns are.

9 Claims, 7 Drawing Sheets

BATTERY MONITORING APPARATUS

CROSS REFERENCE TO RELATED DOCUMENTS

The present application claims the benefit of priority of Japanese Patent Application No. 2018-203298 filed on Oct. 29, 2018, the entire disclosure of which is incorporated herein by reference.

TECHNICAL FIELD

This disclosure generally relates to a battery monitoring apparatus.

BACKGROUND ART

A battery monitoring device, such as one disclosed in Patent Literature 1, is known which is used for a battery assembly equipped with a plurality of electrochemical cells connected in series with each other. Some battery monitoring devices are equipped with a multi-layer substrate. A given one of layers constituting the multi-layer substrate has mounted thereon a plurality of measuring lines each of which measures a potential developed at a terminal of one of the cells. One of the layers other than the above given layer has solid patterns mounted away from the measuring lines in a stacking direction of the layers.

With the above arrangements of the solid patterns, each of the measuring lines is capacitively coupled with a corresponding one of the solid patterns through a parasitic capacitance existing between them, thereby causing noise propagating in the measuring lines to be transmitted to the solid patterns and thereby reducing the amount of the noise in the measuring lines.

PRIOR ART PATENT DOCUMENT

Patent Literature 1: International Publication No. 2014/184920

SUMMARY OF THE INVENTION

A clearance between the measuring lines and the solid patterns has restrictions on an electrically insulating distance that is a distance between the measuring lines and the solid patterns. In other words, the higher a difference in electrical potential between the measuring lines and the solid patterns arranged away from the measuring lines in the stacking direction, the larger the insulating distance should be. This, therefore, leads to a difficulty in securing the insulating distance in a region away in the stacking direction from one of the measuring lines which is at a higher potential side with an increase in number of the batteries connected in series with each other.

For the above reason, the solid patterns are arranged away in the stacking direction from one of the measuring lines which is at a lower potential side which enables the insulating distance to be ensured without arranging the solid pattern in the region away in the stacking direction from one of the measuring lines which is at the higher potential side where it is difficult to ensure the insulating distance. This results in a reduction in amount of noise in the measuring lines on the lower potential side where the solid patterns exist, but however, no reduction in amount of noise in the measuring lines on the higher potential side where the solid patterns do not exist. This leads to a reduction in accuracy in measuring the voltage at the batteries on the higher potential side.

This disclosure was made in view of the above problems. It is an object to reduce noise in high-potential measuring lines.

A battery monitoring apparatus in this disclosure is used in a battery assembly equipped with a plurality of batteries connected in series with each other. The battery monitoring apparatus comprises: a multi-layer substrate, a plurality of measuring lines, and a plurality of solid patterns. The multi-layer substrate is equipped with a plurality of layers stacked in a given stacking direction. The measuring lines are mounted on a given layer that is one of the layers of the multi-layer substrate. The measuring lines work to measure electrical potentials developed at terminals of the batteries, respectively. The solid patterns are provided one for each of measuring line groups into which the measuring lines are classified in order of electrical potential from lowest to highest. The solid patterns are arranged on one of the layers of the multi-layer substrate other than the given layer and overlap the measuring line groups in a planar view in the stacking direction. The solid patterns are arranged away from each other. The higher electrical potentials of the measuring line groups are, the higher electrical potentials of the corresponding solid patterns are.

In this disclosure, the higher electrical potentials of the measuring line groups are, the higher electrical potentials of the corresponding solid patterns are. This results in a decrease in difference in electrical potential between each of the measuring line groups and a corresponding one of the solid patterns, thereby decreasing an insulating distance required between each of the measuring line groups and a corresponding one of the solid patterns in the stacking direction of the multi-layer substrate. This enables the solid patterns to be arranged for the measuring line groups on the high potential side and achieves capacitive coupling of each of the measuring line groups and a corresponding one of the solid patterns through a parasitic capacitance existing therebetween, thereby achieving transmission of noise propagating in each of the measuring lines to a corresponding one of the solid patterns on the high potential side to reduce the amount of noise in each of the measuring lines.

The decrease in difference in electrical potential between each of the measuring line groups and a corresponding one of the solid patterns results in a decrease in AC impedance between each of the measuring line groups and a corresponding one of the solid patterns, thereby facilitating transmission of noise in the measuring line groups to the solid patterns. This enhances the ability to reduce the noise in the measuring line groups by means of the solid patterns.

BRIEF DESCRIPTION OF THE DRAWINGS

The above described object, another object, features, or beneficial advantages in this disclosure will be apparent from the appended drawings or the following detailed discussion.

In the drawings.

EMBODIMENTS FOR CARRYING OUT THE INVENTION

Embodiments of this disclosure will be described below with reference to the drawings. This disclosure is, however, not limited to the embodiments, but may be altered without departing from the principle of the disclosure.

First Embodiment

Figure 1:
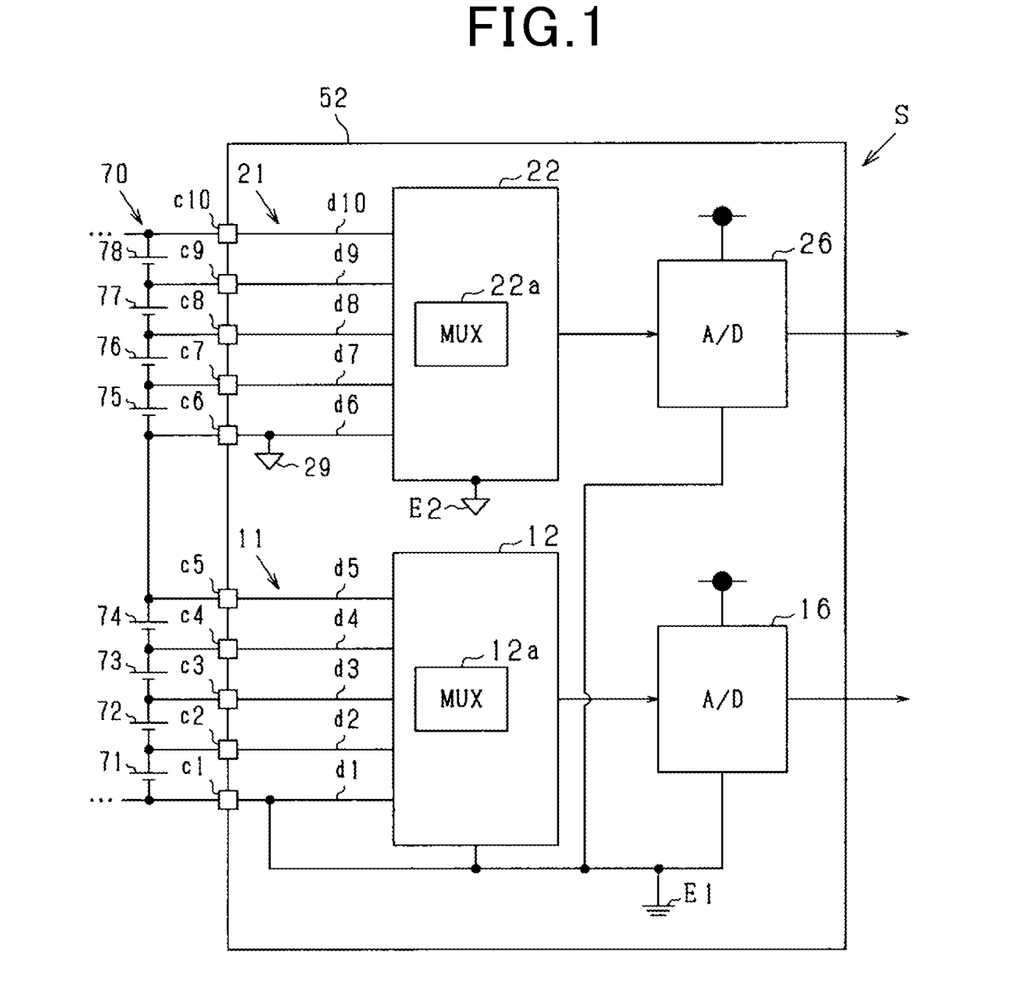
FIG. 1 is a plan view which illustrates a given layer in a battery monitoring apparatus according to the first embodiment.

FIG. 1 is a plan view which illustrates the battery monitoring apparatus S in this embodiment. The battery monitoring apparatus S works to monitor the battery assembly 70. The battery monitoring apparatus S and the battery assembly 70 are mounted in a vehicle. The battery assembly 70 is made up of a plurality of batteries 71 to 78 connected in series with each other. Each of the batteries 71 to 78 may be made of a single cell or a plurality of cells connected in series with each other.

The battery monitoring apparatus S includes a plurality of measuring lines d1 to d10, the first measuring circuit 12, the first A/D converter 16, the second measuring circuit 22, and the second A/D converter 26.

The measuring lines d1 to d10 are used to measure terminal electrical potentials developed at the respective batteries 71 to 78 connected in series with each other. Electrical potentials at the measuring lines d1 to d10, therefore, become higher in sequence. The measuring lines d1 to d10 connect with conductive wires joined to terminals of the batteries 71 to 78 using connectors c1 to c10.

In the following discussion, the measuring lines d1 to d10 are broken down into groups in order of electrical potential from lowest to highest, which will be referred to as the measuring line groups 11 and 21. More specifically, in this embodiment, the measuring lines d1 to d5 that are half of the measuring lines d1 to d10 on a lower potential side will also be referred to as the first measuring line group 11. The measuring lines d6 to d10 that are half of the measuring lines d1 to d10 on a higher potential side will also be referred to as the second measuring line group 21. The measuring lines d1 to d10 may alternatively be classified into three or more groups: the first, the second, the third, the fourth measuring line group, etc. In FIG. 1, the number of the measuring lines d1 to d5 of the first measuring line group 11 and the number of the measuring lines d6 to d10 of the second measuring line group 21 are each five, but however, may alternatively be set to another optional value. The number of the measuring lines of the measuring line group 11 and the number of the measuring lines of the measuring line group 21 does not necessarily need to be equal to each other, but may be values different from each other.

The measuring lines d1 to d5 of the first measuring line group 11 are connected to the first measuring circuit 12. The measuring lines d6 to d10 of the second measuring line group 21 are connected to the second measuring circuit 22. The first measuring circuit 12 is equipped with the first multiplexer 12a and works to sequentially measure a difference in potential between a respective two of the measuring lines d1 to d5 of the first measuring line group 11. The second measuring circuit 22 is equipped with the second multiplexer 22a and works to measure a difference in potential between a respective two of the measuring lines d6 to d10 of the second measuring line group 21.

The measuring line d1 which is lowest in potential in the first measuring line group 11 and a portion of the first measuring circuit 12 at which a reference potential appears are connected to ground, so that they are at a ground potential. In the following discussion, the ground potential will be referred to as a first potential E1. The reference potential at the second measuring circuit 22 will also be referred to as a second potential E2. The second potential E2 is an electrical potential at the measuring line d6 which is the lowest in potential in the second measuring line group 21.

The first A/D converter 16 works to convert measured-voltage signals, as inputted from the first measuring circuit 12 in an analog form, into a digital form and output them to a microcomputer (not shown). The second A/D converter 26 works to convert measured-voltage signals, as inputted from the second measuring circuit 22 in an analog form, into a digital form and output them to the microcomputer. The microcomputer calculates a state of charge (SOC) in each of the batteries 71 to 78 using the digital signals inputted from the first A/D converter 16 and the second A/D converter 26.

Each of the first A/D converter 16 and the second A/D converter 26 is operated on a reference potential that is the first potential E1, while the microcomputer is installed in a low-voltage side circuit operated by an accessory battery which is lower in terminal-to-terminal voltage than the battery assembly 70. The microcomputer is operated on a reference potential that is a ground potential developed at the low-voltage side circuit.

Figure 2:
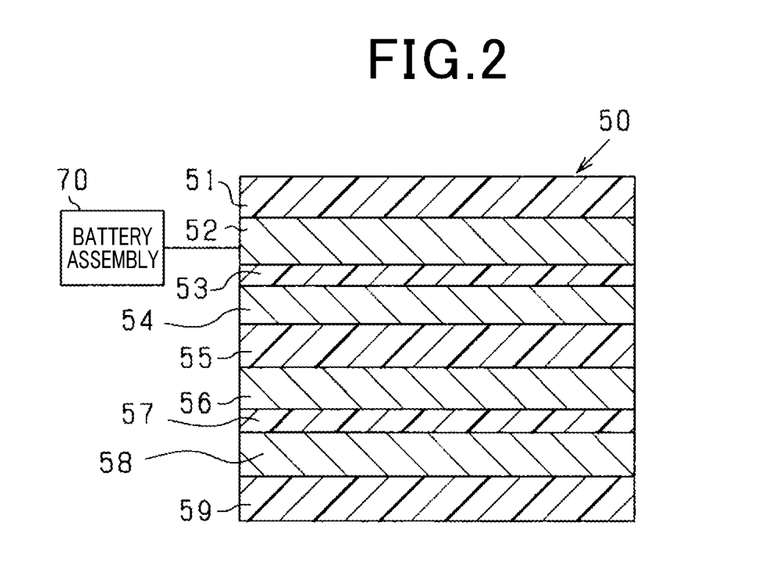
FIG. 2 is a sectional illustration of a battery monitoring apparatus as viewed in a lateral direction.

The battery monitoring apparatus S is equipped with the multi-layer substrate 50 illustrated in FIG. 2. FIG. 2 is a cross sectional view of the multi-layer substrate 50. The multi-layer substrate 50 is made of a plurality of layers 51 to 59 stacked in a given stacking direction. The stacking direction will also be referred to below as a vertical direction. The layers 51 to 59 of the multi-layer substrate 50 will also be referred to below as the first layer 51 to the ninth layer 59 from top to bottom of the multi-layer substrate 50. The first layer 51 is provided as an insulating green solder mask. The second layer 52 is a layer with conductors. The third layer 53 is an insulating prepreg. The fourth layer 54 is a layer with conductors. The fifth layer 55 is made of an insulating core. The sixth layer 56 is a layer with conductors. The seventh layer 57 is made of an insulating prepreg. The eighth layer 58 is a layer with conductors. The ninth layer 59 is an insulating green solder mask.

The second layer 52, as illustrated in FIG. 1, has the measuring lines d1 to d10, the first measuring circuit 12, the first A/D converter 16, the second measuring circuit 22, and the second A/D converter 26 mounted thereon.

Figure 3:
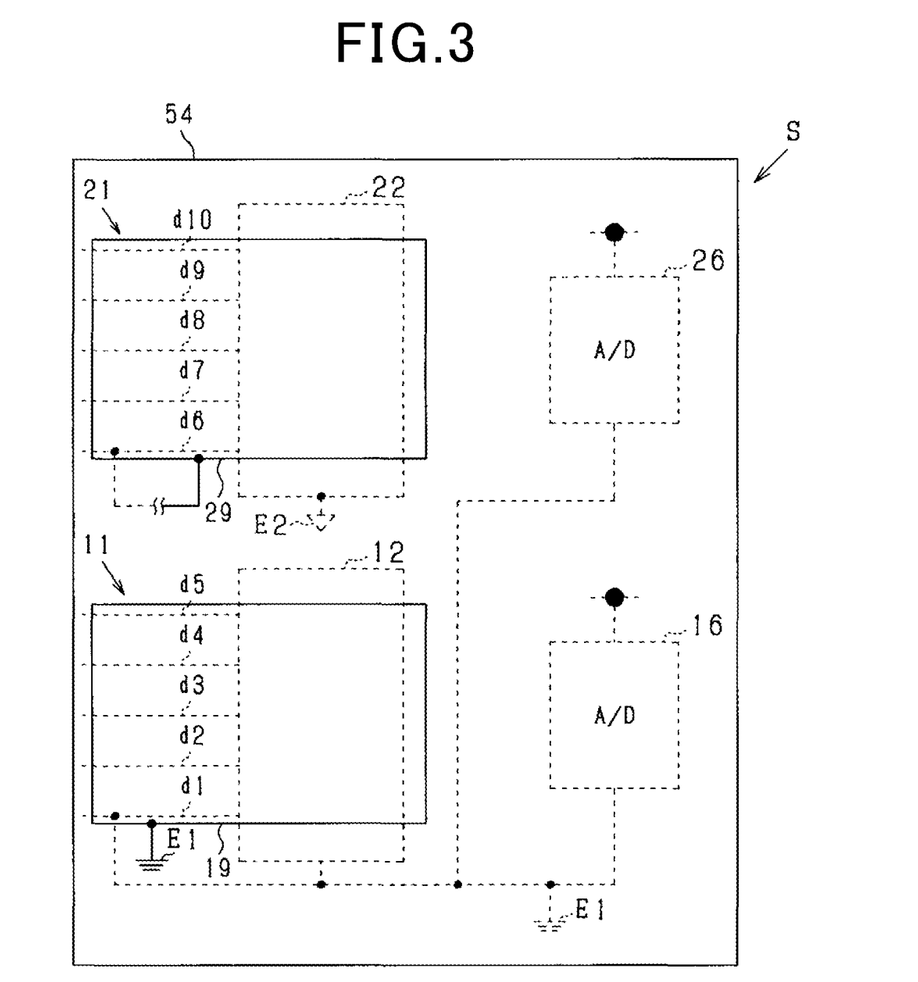
FIG. 3 is a plan view which illustrates a layer other than the above given layer.

FIG. 3 is a plan view which illustrates the fourth layer 54. The fourth layer 54 has mounted thereon the first solid pattern 19 which is located beneath the first measuring line group 11 and the first measuring circuit 12. This causes the first solid pattern 19 to overlap the first measuring line group 11 and the first measuring circuit 12 in planar view. The first solid pattern 19 is connected to ground, so that it is at the first potential E1.

Similarly, the fourth layer 54 also has the second solid pattern 29 located beneath the second measuring line group 21 and the second measuring circuit 22. This causes the second solid pattern 29 to overlap the second measuring line group 21 and the second measuring circuit 22 in planar view. The first and second solid patterns 19 and 29 are disposed away from each other. The second solid pattern 29 is connected to the measuring line d6 which is the lowest in electrical potential in the second measuring line group 21, so that it is placed at the second potential E2.

This embodiment offers the following beneficial advantages. The second solid pattern 29 for the high-voltage side second measuring line group 21 is higher in electrical potential than the first solid pattern 19 for the low-voltage side first measuring line group 11. This results in decreased differences in electrical potential between the first measuring line group 11 and the first solid pattern 19 and between the second measuring line group 21 and the second solid pattern 29, thereby leading to decrease in electrically insulating distance required between the first measuring line group 11 and the first solid pattern 19 and between the second measuring line group 21 and the second solid pattern 29. This enables the first solid pattern 19 and the second solid pattern 29 to be disposed directly beneath the first measuring line group 11 and the second measuring line group 21, respectively.

The above arrangements enable the first measuring line group 11 and the first solid pattern 19 to be capacitively coupled with each other through parasitic capacitance created therebetween and also enable the second measuring line group 21 and the second solid pattern 29 to be capacitively coupled with each other through parasitic capacitance created therebetween. This causes electrical noise generated by the first measuring line group 11 and the second measuring line group 12 to be transmitted to the first solid pattern 19 and the second solid pattern 29, respectively, thereby reducing noise appearing in the measuring lines d1 to d10 of the first measuring line group 11 and the second measuring line group 21.

The decreased differences in electrical potential between the first measuring line group 11 and the first solid pattern 19 and between the second measuring line group 21 and the second solid pattern 29 also results in a decrease in AC impedance between the first measuring line group 11 and the first solid pattern 19 and between the second measuring line group 21 and the second solid pattern 29. This facilitates transmission of noise created by the first measuring line group 11 and the second measuring line group 21 to the first solid pattern 19 and the second solid pattern 29, thereby enhancing a reduction in noise, as generated by the first measuring line group 11 and the second measuring line group 12, by the first solid pattern 19 and the second solid pattern 29.

The first solid pattern 19 is placed at the first potential E1. The second solid pattern 29 is placed at the second potential E2. The first solid pattern 19, therefore, has a minimum AC impedance between itself and a portion of the first measuring line group 11 and the first measuring circuit 12 which is at the first potential E1. Similarly, the second solid pattern 29 has a minimum AC impedance between itself and a portion of the second measuring line group 21 and the second measuring circuit 22 which is at the second potential E2. This, therefore, achieves the easiest transmission of noise, as created by the portion of the first measuring line group 11 and the first measuring circuit 12 which is at the first potential E1, to the first solid pattern 19 and also achieves the easiest transmission of noise, as created by the portion of the second measuring line group 21 and the second measuring circuit 22 which is at the second potential E2, to the second solid pattern 29. This, therefore, achieves effectiveness in reducing the amount of noise impinging on the first potential E1 and the second potential E2, thereby ensuring the stability of the first potential E1 and the second potential E2.

The first potential E1 is a reference potential for the first measuring circuit 12. The stability in operation of the first measuring circuit 12 is, therefore, ensured by stabilizing the first potential E1. Similarly, the second potential E2 is a reference potential for the second measuring circuit 22. The stability in operation of the second measuring circuit 22 is ensured by stabilizing the second potential E2.

Particularly, in this embodiment, a measured-voltage signal outputted from the second measuring circuit 22 which uses the second potential E2 as the reference potential is inputted into the second A/D converter 26 which uses the first potential E1 as the reference potential. The generation of noise only in one of the first potential E1 and the second potential E2, therefore, results in a variation in difference between the first potential E1 and the second potential E2 (i.e., E2–E1). This leads to a risk that the operation of the second A/D converter 26 may become unstable. In contrast, this embodiment, as described above, stabilizes the first potential E1 and the second potential E2 and thereby eliminates the above problem.

The third layer 53 which is lowest in thickness in the multi-layer substrate 50, not the fifth layer 55 which is highest in thickness in the multi-layer substrate 50, is interposed between the first measuring line group 11 and the first solid pattern 19 and between the second measuring line group 21 and the second solid pattern 29. This facilitates the ease with which parasitic capacitance is established between the first measuring line group 11 and the first solid pattern 19 and between the second measuring line group 21 and the second solid pattern 29, thereby enhancing the ability to reduce the noise.

Second Embodiment

The second embodiment of this disclosure will be discussed below in terms of differences between itself and the first embodiment. The same reference number as those in the first embodiment will refer to the same or similar parts.

Figure 4:
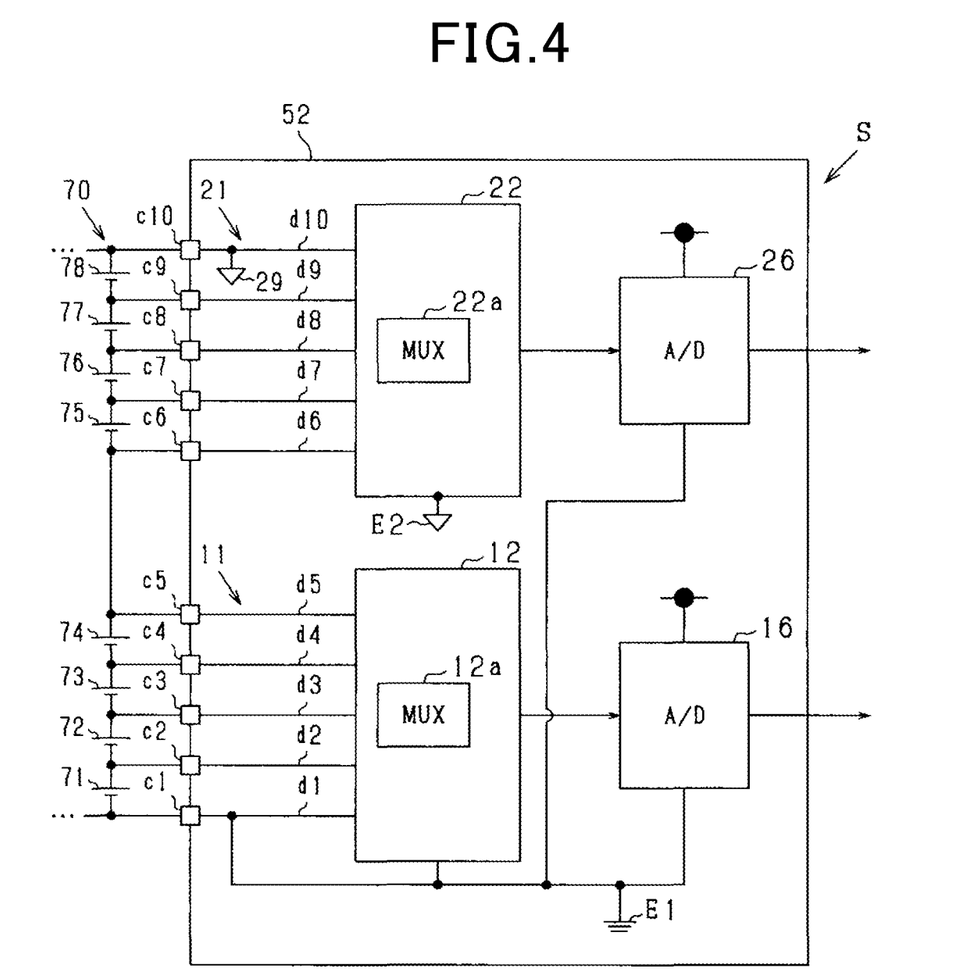
FIG. 4 is a plan view which illustrates a given layer in a battery monitoring apparatus according to the second embodiment.

FIG. 4 is a plan view which illustrates the second layer 52 of the battery monitoring apparatus S in this embodiment. One of the measuring line d7 to d10 other than the measuring line d6 which is lowest in electrical potential in the second measuring line group 21 is connected to the second solid pattern 29. The second solid pattern 29 is, therefore, not placed at the second potential E2, but at an electrical potential appearing at one of the measuring lines d7 to d10. Specifically, in the example of FIG. 4, the measuring line d10 which is highest in electrical potential in the second measuring line group 21 is connected to the second solid pattern 29, so that the second solid pattern 29 is placed at the highest electrical potential.

The second solid pattern 29 is, as described above, connected to a selected one of the measuring lines d7 to d10 of the second measuring line group 21, so that an electrical potential at the second solid pattern 29 is identical with that at the selected one of the measuring lines d7 to d10.

Third Embodiment

Figure 5:
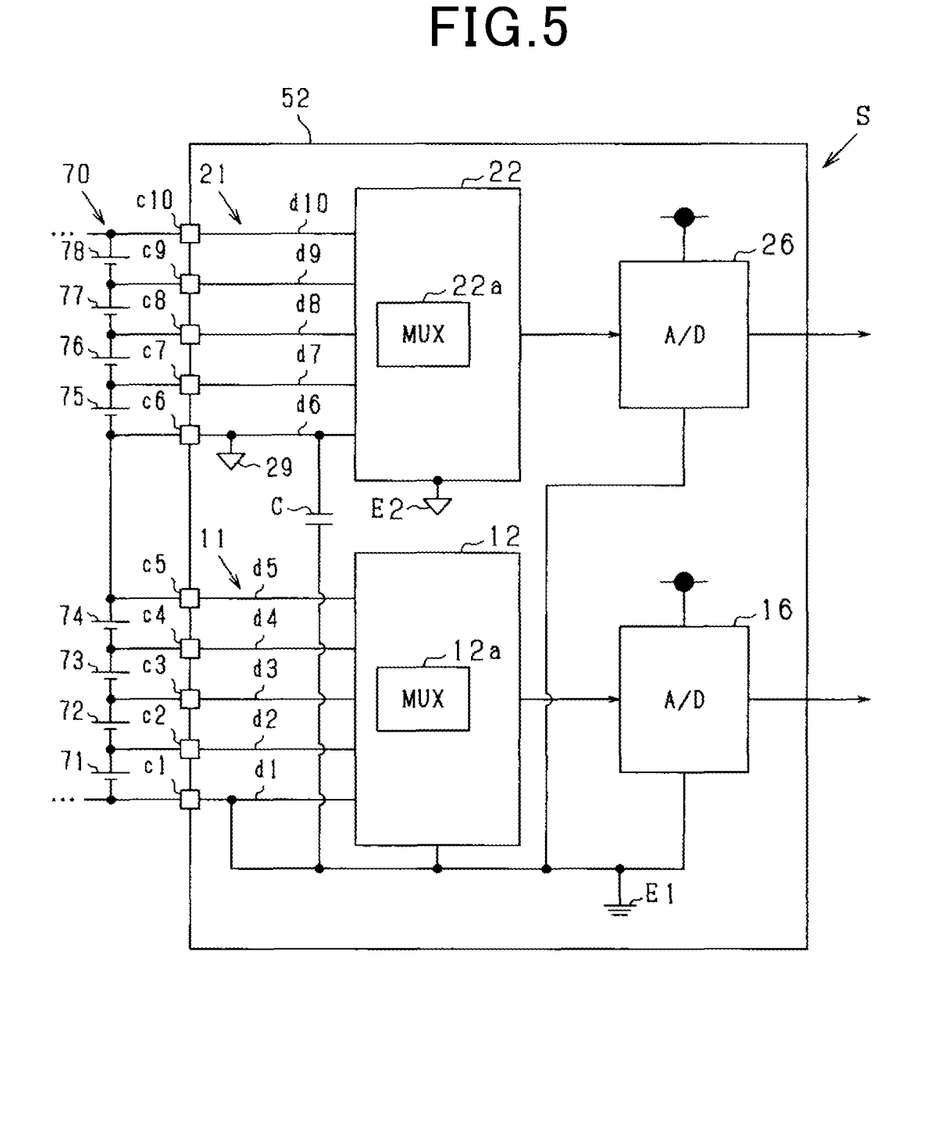
FIG. 5 is a plan view which illustrates a given layer in a battery monitoring apparatus according to the third embodiment.

FIG. 5 is a plan view which illustrates the second layer 52 of the battery monitoring apparatus S in this embodiment.

The measuring line d1 which is lowest in electrical potential in the first measuring line group 11 is connected to the measuring line d6 which is lowest in electrical potential in the second measuring line group 21 through a capacitor C. In other words, the measuring line d1 placed at the first potential E1 and the measuring line d6 placed at the second potential E2 are connected together through the capacitor C.

This embodiment offers the following beneficial advantages. The noise from one of the first potential E1 and the second potential E2 is transmitted to the other through the capacitor C. This equalizes deviations of the first potential E1 and the second potential E2, thereby keeping a difference between the first potential E1 and the second potential E2 (i.e., E2−E1) constant even if noise is added to one of the first potential E1 and the second potential E2. This minimizes adverse effects arising from a variation in the potential difference.

Fourth Embodiment

Figure 6:
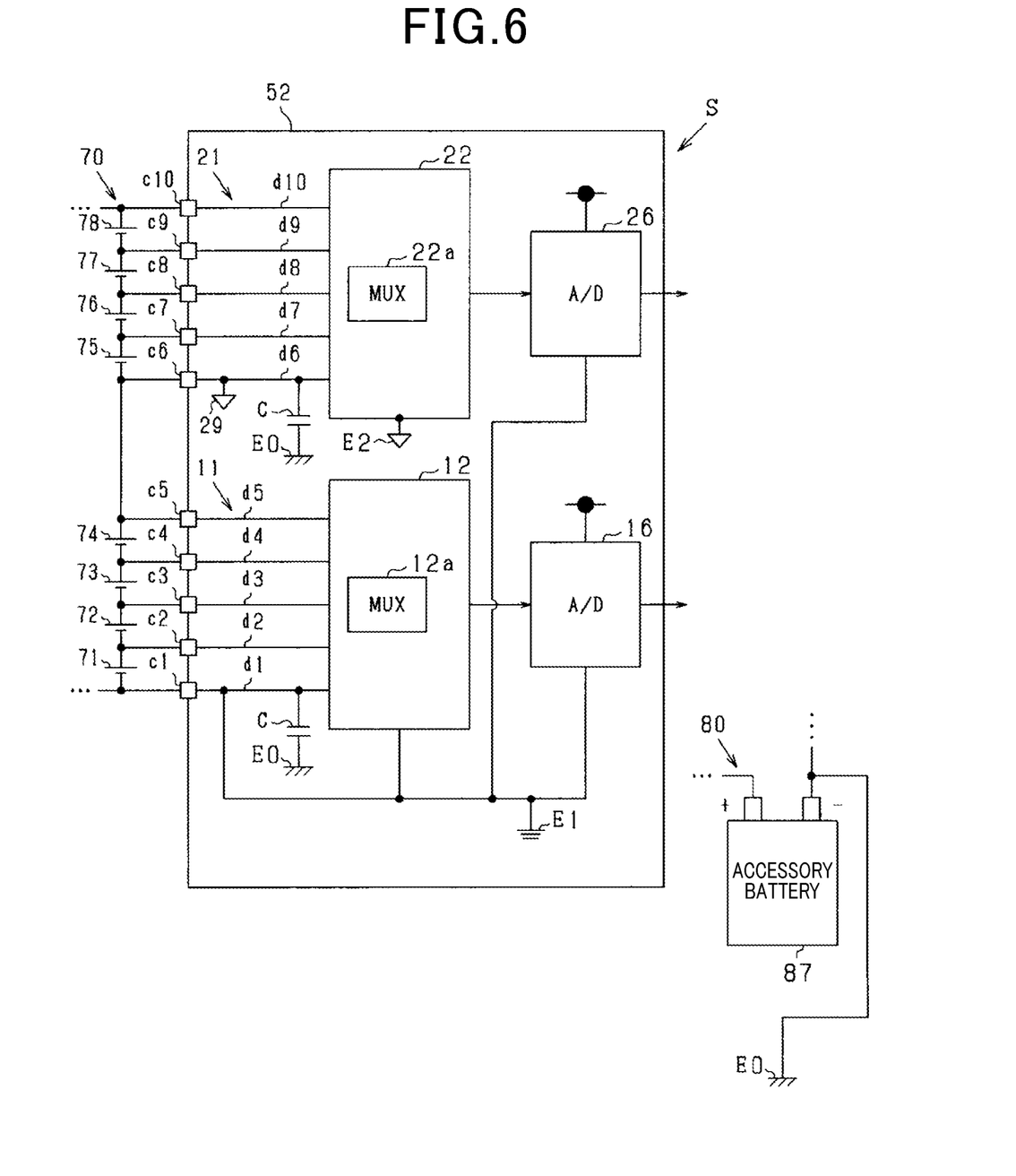
FIG. 6 is a plan view which illustrates a given layer in a battery monitoring apparatus according to the fourth embodiment.

FIG. 6 is a plan view which illustrates the second layer 52 of the battery monitoring apparatus S in this embodiment. Each of the measuring line groups 11 and 21 has a measuring line(s) which is capacitively coupled with the ground potential E0 of the low-voltage side circuit 80, such as a housing of the battery monitoring apparatus S. The low-voltage side circuit 80 is, as described above, a circuit operated by the accessory battery 87 which is lower in terminal-to-terminal voltage than the battery assembly 70. The low-voltage side circuit 80 is equipped with a microcomputer. The low-voltage side circuit 80 is electrically isolated from circuits connected to the battery assembly 70.

The capacitive coupling may be, as illustrated in FIG. 6, accomplished with connection of each of the measuring lines d1 and d6 of the measuring line groups 11 and 21 to the ground potential E0 of the low-voltage side circuit 80 through the capacitor C.

The capacitive coupling may alternatively be achieved by connection of each of the solid patterns 19 and 29 to the housing through a parasitic capacitance existing therebetween. In this case, each of the measuring line groups 11 and 21 is capacitively coupled with the ground potential E0 of the low-voltage side circuit 80 through a corresponding one of the solid patters 19 and 29.

The capacitive coupling may alternatively be achieved by capacitively coupling each of the solid patterns 19 and 20 with a given conductor through a parasitic capacitance existing therebetween and also capacitively coupling the conductor with the housing through a parasitic capacitance existing therebetween. In this case, each of the measuring line groups 11 and 21 is capacitively coupled with the ground potential E0 of the low-voltage side circuit 80 through a corresponding one of the solid patterns 19 and 29.

The above arrangements of this embodiment achieve transmission of noise, as occurring in each of the measuring line groups 11 and 21, to the ground potential E0 of the low-voltage side circuit 80 as well as to the solid patterns 19 and 29 located beneath the measuring line groups 11 and 21. This enhances the ability to reduce the noise in each of the measuring line groups 11 and 21.

Fifth Embodiment

Figure 7:
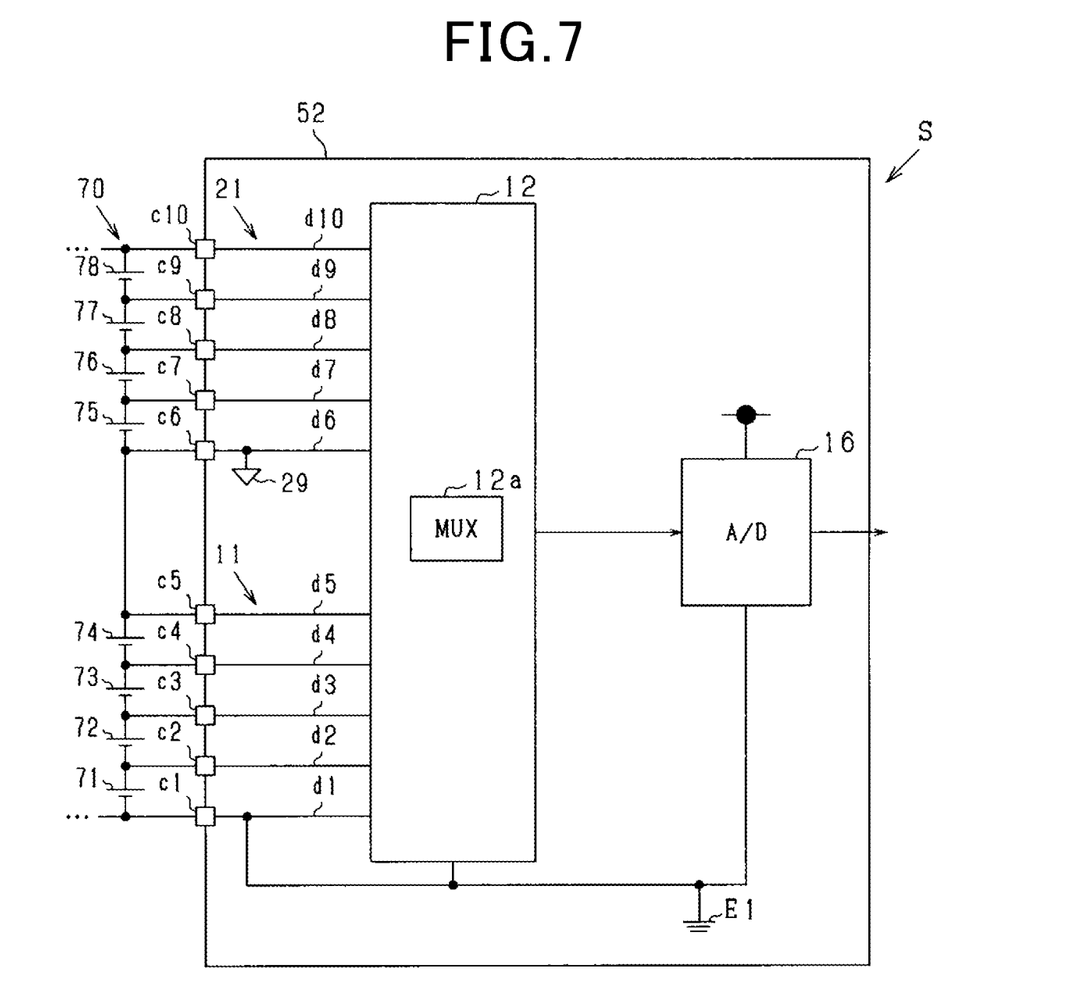
FIG. 7 is a plan view which illustrates a given layer in a battery monitoring apparatus according to the fifth embodiment.

FIG. 7 is a plan view which illustrates the given layer 52 of the battery monitoring apparatus S in this embodiment. This embodiment is designed not to have the second measuring circuit 22 and the second A/D converter 26 and to have the measuring lines d1 to d10 all of which are connected to the first measuring circuit 12. This embodiment realizes a simpler structure of the battery monitoring apparatus S.

Other Embodiments

Each of the above embodiments may be altered in the following ways. For instance, a third measuring line group and/or a fourth measuring line group may be arranged on a side higher in electrical potential than the second measuring line group 21. A third solid pattern and/or a fourth solid pattern may also be disposed directly beneath the third measuring line group and/or the fourth measuring line group. In this case, the third solid pattern is electrically connected to one of measuring lines of the third measuring line group. The fourth solid pattern is electrically connected to one of measuring lines of the fourth measuring line group.

For instance, alternative to the solid patterns 19 and 29 disposed directly beneath the measuring lines d1 to d10, they may be disposed directly above the measuring lines d1 to d10. Alternative to connection of the first solid pattern 19 to ground, it may be electrically connected to one of the line measuring lines d1 to d5 of the first measuring line group 11.

Alternative to the arrangement of a single insulating layer between the first measuring line group 11 and the first solid pattern 19 or between the second measuring line group 21 and the second solid pattern 29, two or more insulating layers may be disposed therebetween. The fifth layer 55 which is the largest in thickness may alternatively be arranged between the first measuring line group 11 and the first solid pattern 19 or between the second measuring line group 21 and the second solid pattern 29.

Alternative to the arrangement of the first solid pattern 19 underneath the first measuring line group 11 and the first measuring circuit 12, it may be disposed directly beneath only the first measuring line group 11. Similarly, alternative to the arrangement of the second solid pattern 29 underneath the second measuring line group 21 and the second measuring circuit 22, it may be disposed directly beneath only the second measuring line group 21. The first solid pattern 19 may alternatively be disposed directly beneath all parts having the first potential E1 as the reference potential, i.e., the first measuring line group 11, the first measuring circuit 12, the first A/D converter 16, the second A/D converter 26, the first solid pattern 19.

Alternative to the arrangement of the first solid pattern 19 and the second solid pattern 29 on the same layer, they may be disposed on the different layers, respectively. Further, in such a case, the second solid pattern 29 is partially disposed directly beneath or above a portion of the first solid pattern 19, thereby achieving a capacitive coupling between the first solid pattern 19 and the second solid pattern 29 through a parasitic capacitance existing therebetween. This also equalizes deflections of the first potential E1 and the second potential E2, thereby keeping a difference between the first potential E1 and the second potential E2 (i.e., E2−E1) constant.

An operational amplifier may also be disposed between the first measuring circuit 12 and the first A/D converter 16. The operational amplifier works to amplify the measured-voltage signal inputted from the first measuring circuit 12 and output it to the first A/D converter 16. Additionally, an operational amplifier which works to amplify the measured-voltage signal inputted from the second measuring circuit 22 and output it to the second A/D converter 26 may also be disposed between the second measuring circuit 22 and the second A/D converter 26.

While this disclosure has been shown in terms of the preferred embodiments, it should be appreciated that the disclosure is not limited to the structures of the embodiments. Therefore, the disclosure should be understood to include all possible embodiments and modifications. Additionally, various combinations of the embodiments or another combination including one or more parts of the embodiments also fall in the technical scope of this disclosure.

What is claimed is:

1. A battery monitoring apparatus for use in a battery assembly equipped with a plurality of batteries connected in series with each other, the battery monitoring apparatus comprising:
    a multi-layer substrate having a plurality of layers stacked in a stacking direction;
    a plurality of measuring lines, wherein the plurality of measuring lines are:
        mounted on a first layer of the plurality of layers of the multi-layer substrate,
        electrically connected by way of connectors of the battery monitoring apparatus to terminals of the batteries and electrically connected to at least one measuring circuit so as to measure electrical potentials at the terminals of the batteries, respectively,
        arranged in order of electrical potential from lowest to highest, and
        divided into a plurality of measuring line groups, the electrical potentials of the measuring lines of a first of the plurality of measuring line groups being less than the electrical potentials of the measuring lines of a second of the plurality of measuring line groups; and
    a plurality of solid patterns arranged away from the terminals of the batteries and away from the connectors of the battery monitoring apparatus, one of the plurality of solid patterns being provided for each of the plurality of measuring line groups, wherein the plurality of solid patterns:
        are arranged on a second layer of the plurality of layers of the multi-layer substrate, which is other than the first layer,
        include at least a first solid pattern and a second solid pattern, whose electrical potential is higher than that of the first solid pattern, the first and second solid patterns respectively overlapping the first and second measuring line groups in a planar view in the stacking direction, and
        are arranged away from each other.

2. The battery monitoring apparatus as set forth in claim 1, wherein the second solid pattern is connected to one of the measuring lines of the second measuring line group so that the second solid pattern is at the electrical potential of the one measuring line of the second measuring line group.

3. The battery monitoring apparatus as set forth in claim 2, further comprising a plurality of the measuring circuits, one for each of the plurality of measuring line groups electrically connected therewith,
    wherein each of the measuring circuits is operated on a reference potential which is an electrical potential of one of the measuring lines that is lowest in electrical potential in a corresponding one of the plurality of measuring line groups connected thereto, and
    wherein the electrical potential of each of the plurality of solid patterns is the reference potential for one of the measuring circuits to which a corresponding one of the plurality of measuring line groups is connected.

4. The battery monitoring apparatus as set forth in claim 3, wherein ones of the measuring lines whose electrical potentials serve as the reference potentials for the measuring circuits are connected together through a capacitor.

5. The battery monitoring apparatus as set forth in claim 3, further comprising converter circuits, one for each of the measuring circuits,
    wherein each of the converter circuits converts a measured-voltage signal, as inputted from a corresponding one of the measuring circuits, and outputs it, and
    wherein each of the converter circuits is operated on a reference potential, which is the reference potential of one of the measuring circuits to which one of the plurality of measuring line groups which is lowest in electrical potential is connected.

6. The battery monitoring apparatus as set forth in claim 1,
    wherein the layers of the multi-layer substrate include a plurality of insulating layers that have electrically insulating properties and are different in thickness from each other, and
    wherein one of the insulating layers, which is other than one of the insulating layers that is largest in thickness, is disposed between each of the measuring line groups and a corresponding one of the plurality of solid patterns.

7. The battery monitoring apparatus as set forth in claim 1, wherein each of the plurality of measuring line groups is connected to a ground potential of a circuit driven by an accessory battery through a capacitor.

8. The battery monitoring apparatus as set forth in claim 1, wherein:
    the at least one measuring circuit includes a first measuring circuit and a second measuring circuit, the first and second measuring circuits being provided for the first and second measuring line groups, respectively;
    the first measuring circuit includes a first multiplexer that measures a difference in electrical potential between two of the measuring lines of the first measuring line group; and
    the second measuring circuit includes a second multiplexer that measures a difference in electrical potential between two of the measuring lines of the second measuring line group.

9. The battery monitoring apparatus as set forth in claim 8, further comprising:
    a first A/D converter that converts analog voltage signals output from the first measuring circuit into digital signals; and
    a second A/D converter that converts analog voltage signals output from the second measuring circuit into digital signals.

* * * * *